United States Patent
Hiwada et al.

(10) Patent No.: US 9,799,927 B2
(45) Date of Patent: Oct. 24, 2017

(54) REPAIR APPARATUS OF SHEET TYPE CELL

(75) Inventors: Kiyoyasu Hiwada, Tokyo (JP); Harutada Dewa, Tokyo (JP); Akira Nakazawa, Tokyo (JP); Nobuaki Terakado, Hyogo-Ken (JP)

(73) Assignees: KABUSHIKI KAISHA NIHON MICRONICS, Tokyo (JP); GUALA TECHNOLOGY CORPORATION, Hyogo-Ken (JP)

( * ) Notice: Subject to any disclaimer, the term of this patent is extended or adjusted under 35 U.S.C. 154(b) by 808 days.

(21) Appl. No.: 14/357,856

(22) PCT Filed: Nov. 14, 2011

(86) PCT No.: PCT/JP2011/076200
§ 371 (c)(1),
(2), (4) Date: Jul. 11, 2014

(87) PCT Pub. No.: WO2013/072988
PCT Pub. Date: May 23, 2013

(65) Prior Publication Data
US 2015/0000119 A1    Jan. 1, 2015

(51) Int. Cl.
*H01M 10/42* (2006.01)
*H01L 31/18* (2006.01)
*H01L 31/20* (2006.01)

(52) U.S. Cl.
CPC .......... *H01M 10/42* (2013.01); *H01L 31/186* (2013.01); *H01L 31/208* (2013.01);
(Continued)

(58) Field of Classification Search
CPC . H01M 10/42; H01M 10/4242; H01L 31/186; H01L 31/208; Y10T 29/53135; Y02P 70/521; Y02E 10/50
(Continued)

(56) References Cited

U.S. PATENT DOCUMENTS 4,464,823 A * 8/1984 Izu .................. G01R 31/025
                                              136/290
4,806,496 A   2/1989 Suzuki et al.
(Continued)

FOREIGN PATENT DOCUMENTS

EP     0134364 A2   3/1985
EP     1052704 A2   11/2000
(Continued)

OTHER PUBLICATIONS

Machine translation of Fujii et al. Japanese Patent Document S63-088869 A Apr. 19, 1988.*
(Continued)

*Primary Examiner* — Scott Bauer
*Assistant Examiner* — Kevin J Comber
(74) *Attorney, Agent, or Firm* — Bacon & Thomas, PLLC

(57) ABSTRACT

A repair apparatus of a sheet type cell is capable of appropriately repairing and detoxifying defects of a sheet type cell having semiconductor characteristics. The repair apparatus repairs a sheet type cell in which a storage layer is sandwiched by layers of a positive electrode and a negative electrode and at least the storage layer has semiconductor characteristics. The repair apparatus applies electrical stimulation between the positive electrode and the negative electrode, measures electrical characteristics of the sheet type cell when the electrical stimulation is applied, and specifies a value of the electrical stimulation by the electrical stimulation source while considering measured electrical characteristics.

11 Claims, 9 Drawing Sheets

(52) U.S. Cl.
CPC ......... *H01M 10/4242* (2013.01); *Y02E 10/50* (2013.01); *Y02P 70/521* (2015.11); *Y10T 29/53135* (2015.01)

(58) Field of Classification Search
USPC .......................................... 361/225; 29/730
See application file for complete search history.

(56) References Cited

U.S. PATENT DOCUMENTS

| 2010/0067089 | A1 | 3/2010 | Nakazawa | |
|---|---|---|---|---|
| 2012/0288968 | A1* | 11/2012 | Hsieh | H01L 22/14 438/4 |

FOREIGN PATENT DOCUMENTS

| JP | S63-88869 A | 4/1988 |
|---|---|---|
| JP | 05-003333 | 1/1993 |
| JP | H10-4202 A | 1/1998 |
| JP | H11-204816 A | 7/1999 |
| JP | 3050546 B1 | 6/2000 |
| JP | 2000-277775 | 10/2000 |
| JP | 2001-053302 A | 2/2001 |
| JP | 2001-053303 | 2/2001 |
| JP | 2001-053303 A | 2/2001 |
| JP | 2003-215190 A | 7/2003 |
| JP | 2003-332597 | 11/2003 |
| JP | 2006-332469 A | 12/2006 |
| JP | 2009-135025 A | 6/2009 |
| JP | 2011-054482 | 3/2011 |
| WO | WO2008053561 A1 | 5/2008 |

OTHER PUBLICATIONS

Machine translation of Hayashi et al. Japanese Patent Document 2000-277775 A Oct. 6, 2000.*
Literature [New Development of Semiconductor Secondary Cell (Guala Battery)] by Professor H. Kajiyama.
Supplementary Extended European Search Report dated Aug. 21, 2015 in corresponding European Patent Application No. 11875625.3.

* cited by examiner

FIG.1
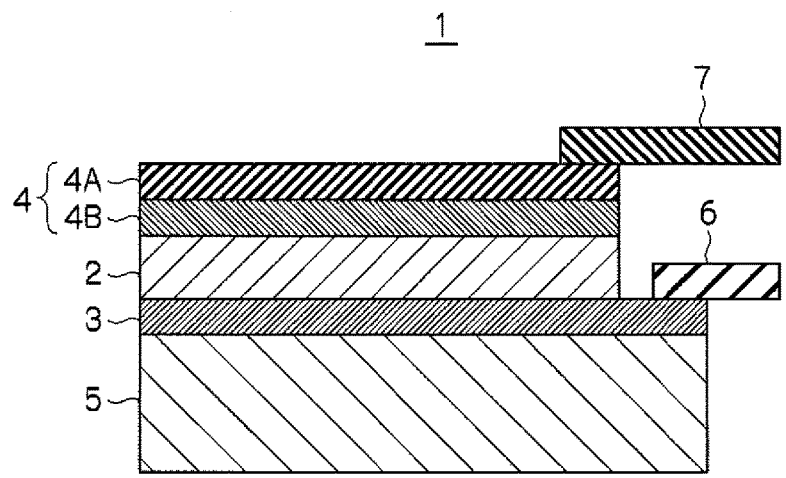
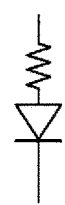   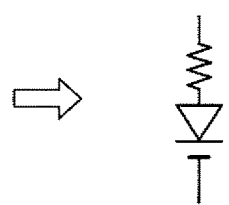
FIG.2A          FIG.2B            FIG.2C              FIG.2D
EMPTY          DURING            DURING              EQUIVALENT ELEMENT
STATE          CHARGING          DISCHARGING         REPRESENTATION

REPAIR APPARATUS OF SHEET TYPE CELL

TECHNICAL FIELD

The present invention relates to a repair apparatus of a sheet type cell, which can be applied to repair of a cell based on an operation principal of forming a new energy level in a band gap and capturing an electron by utilizing a photo-excited structural change of a metal oxide (hereinafter referred to as a quantum cell), for example.

BACKGROUND ART

As sheet type (parallel plate structure) secondary cells, nickel-metal hydride cells (NiMH) and lithium ion secondary cells (LIB) are known. However, it is considered to be difficult to electrically repair defects of these secondary cells. This is because, after filling electrolytes, the applicable electrical stimulation is allowed only in the range of a charging operation, and a voltage of reversed polarity cannot be applied, for example. This is the same as in solid LIBs and fuel cells.

Here, solar cells are known as plate type devices. The solar cell is not a cell, but has semiconductor characteristics, and the electrical repair of defects thereof is implemented (see Patent Document 1 to Patent Document 3). The suggested repair of a solar cell is performed by electrical stimulation with a voltage source brought into contact with comb-shaped electrodes of the solar cell. The voltage is applied between adjacent comb-shaped electrodes so that a reverse bias voltage is applied to PN junctions of the solar cell. It is to be noted that in the technology described in Patent Document 2, based on the application of a reverse bias voltage while it is varied periodically (sawtooth waves, for example), a forward bias voltage of an off area is applied for only short period of time during the period in which a reverse bias voltage is applied so as to let electric charge accumulated by application of the reverse bias voltage escape.

PRIOR ART DOCUMENT

Patent Document

Patent Document 1: Japanese Patent Laid-Open 2000-277775
Patent Document 2: Japanese Patent Laid-Open 2001-53303
Patent Document 3: Japanese Patent Laid-Open 2011-54482

DISCLOSURE OF THE INVENTION

Problems to be Solved by the Invention

However, the repair of the solar cell according to Patent Document 1 to Patent Document 3 described above only mentions electrical stimulation with a voltage source brought into contact with comb-shaped electrodes of the solar cell. That is, conventionally, there exists no disclosure or suggestion of how to repair sheet type cells whose electrodes are not comb-shaped such as quantum cells.

The invention is made in view of the above-described circumstances, and aims at providing a repair apparatus of a sheet type cell that is capable of appropriately repairing and detoxifying defects of a sheet type cell having semiconductor characteristics.

Means to Solve the Problems

In order to solve the above described problems, the present invention provides a repair apparatus of a sheet type cell for repairing the sheet type cell in which a storage layer is sandwiched by layers of a positive electrode and a negative electrode and at least the storage layer has semiconductor characteristics, the repair apparatus including (1) an electrical stimulation source that applies electrical stimulation between the positive electrode and the negative electrode, (2) an electrical characteristic measurement means that measures electrical characteristics of the sheet type cell when the electrical stimulation is applied, and (3) a control means that specifies a value of the electrical stimulation by the electrical stimulation source while considering measured electrical characteristics.

Effect of the Invention

According to the present invention, it is possible to provide a repair apparatus of a sheet type cell that is capable of appropriately repairing and detoxifying defects of a sheet type cell having semiconductor characteristics.

BRIEF DESCRIPTION OF THE DRAWINGS

FIG. 1 is an explanatory view showing a basic structure of a quantum cell which is an object to be repaired by a repair apparatus of a sheet type cell according to an embodiment.

FIG. 2 shows equivalent element representation of a quantum cell which is an object to be repaired by the repair apparatus according to the embodiment.

BEST MODE FOR CARRYING OUT THE INVENTION

(A) Main Embodiment

Figure 3:
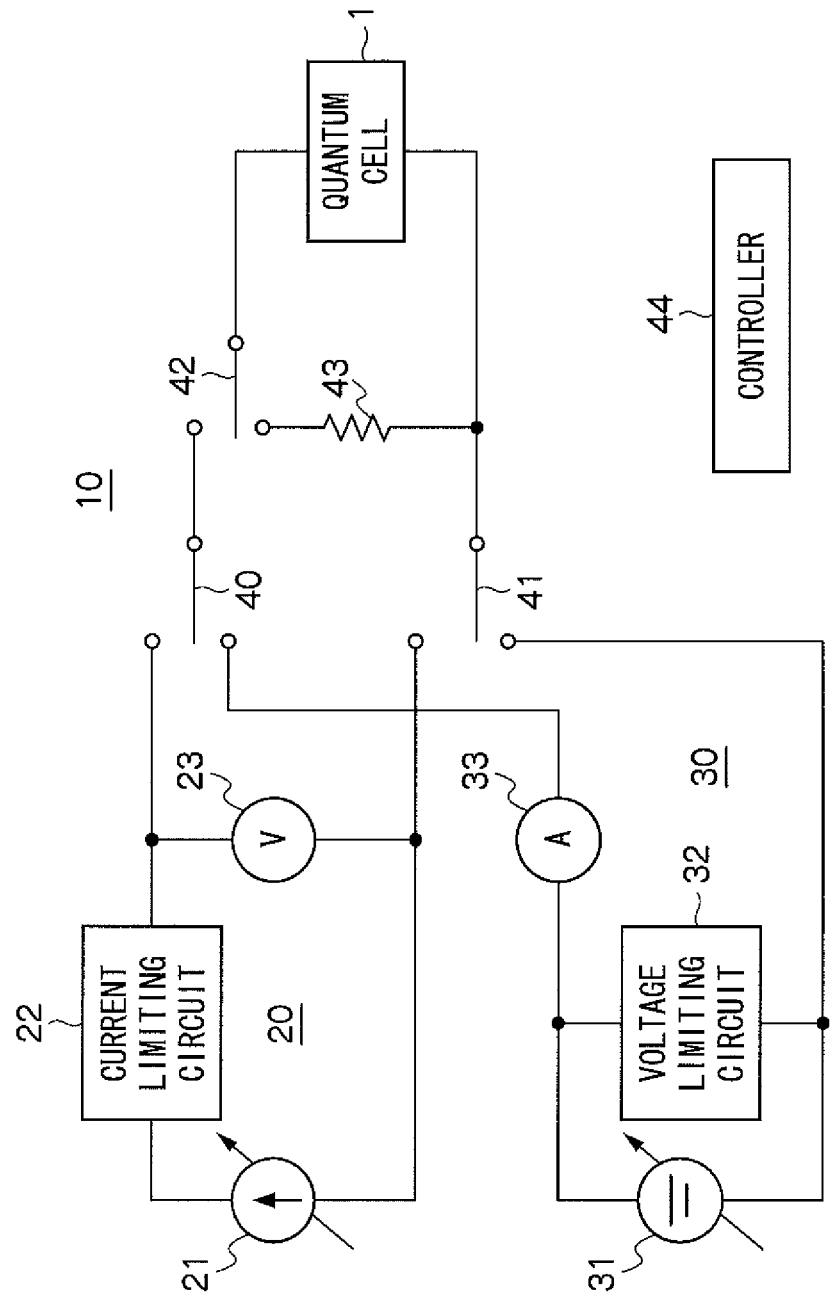
FIG. 3 is a block diagram showing a configuration of the repair apparatus of a sheet type cell according to the embodiment.

An embodiment of a repair apparatus of a sheet type cell according to the present invention is described below by referring to the attached drawings.

A sheet type cell having semiconductor characteristics is suitable for an object to be repaired. Hereinafter, the repair apparatus according to the embodiment is described supposing that a quantum cell is the object to be repaired, for example.

(A-1) Explanation of Sheet Type Cell which can be Object to be Repaired

FIG. 1 is an explanatory view showing a layered structure of a sheet type cell which is an object to be repaired.

A sheet type cell to be repaired is not limited to the one which is implemented as a secondary cell, but may be the one which is implemented as a primary cell. Hereinafter, explanation is given supposing that the sheet type cell is a secondary cell. Also, any sheet type (parallel plate type) cell is suitable for an object to be repaired. For example, as shown in FIG. 1, a solid state sheet type cell 1 in which a storage layer 2 having a function as an electricity storage unit is sandwiched between layers of a positive electrode 4 and a negative electrode 3 may be an object to be repaired. FIG. 1 shows the state where the sheet type cell 1 is attached on a substrate 5, and a positive electrode terminal 7 and a negative electrode terminal 6 are attached on the positive electrode 4 and the negative electrode 3, respectively. For example, the above-described quantum cell in which a photoexcited structural change is used may be an object to be repaired.

Hereinafter, a quantum cell in which a photoexcited structural change is used, which may be the object to be repaired, is briefly described. The storage layer in the quantum cell is referred to as a charging layer, in view of its characteristics.

The charging layer stores electrons with a charging operation, releases the charged electrons with a discharging operation, and keeps the electrons (storage of electricity) in a state without charging/discharging. The charging layer is formed by applying a technology of photoexcited structural change.

The photoexcited structural change is described in International Patent application JP2006/322011, for example, and is a phenomenon (technology) found out by Akira Nakazawa, who is the inventor of the above application (also an inventor of this application). That is, Akira Nakazawa found out that, when effective excitation energy is applied to an insulation-coated translucent metal oxide which is a semiconductor having a band gap as same as or more than a constant value, a lot of energy levels with no electron are generated in the band gap. The quantum cell is charged by capturing electrons in these energy levels, and discharged by releasing the captured electrons.

In the quantum cell, the positive electrode 4 includes an electrode main body layer 4A and a p-type metal oxide semiconductor layer 4B formed to be in contact with the charging layer 2. The p-type metal oxide semiconductor layer 4B is provided to prevent injection of electrons from the electrode main body layer 4A to the charging layer 2.

The electrode main body layers of the negative electrode 3 and the positive electrode 4 are simply required to be formed as conductive layers.

The charging layer 2 is formed in a way where insulation-coated n-type metal oxide semiconductor particles adhere to the negative electrode 3 in a thin film shape, and is transformed to be capable of storing electrons with a photoexcited structural change caused at the n-type metal oxide semiconductor by ultraviolet irradiation.

(A-2) Equivalent Element Representation of Quantum Cell

The operation mechanism of a quantum cell is still not completely clarified, but it is considered that the quantum cell has an equivalent configuration with an intermediate level in which electrons are stored in a portion corresponding to a junction of diodes.

FIG. 2 shows the equivalent element representation of a quantum cell. FIG. 2(A) represents a unit part of a quantum cell in the empty state where electrons are not charged, which can be shown by a series circuit with a resistor and a diode. FIG. 2(B) represents a unit part of a quantum cell during charging, which can be shown by a series circuit with a resistor, a diode, and a cell (DC power source) whose + terminal is connected to a cathode of the diode. FIG. 2(C) represents a unit part of a quantum cell during discharging, which can be shown by a series circuit with a resistor and a cell (DC power source) whose + terminal is connected to the resistor. The quantum cell itself is a new device, and thus no symbol for the element exists. Here, the equivalent element representation shown in FIG. 2(D) is applied. That is, the quantum cell is shown by a series circuit with a resistor and an element in which a diode and a cell are integrated. In FIG. 2(D), the element in which the diode and the cell are integrated is shown by representation in which a line is commonly shown as a horizontal line representing the side of the cathode of the diode and a horizontal line representing the positive electrode of the cell. It is to be noted that the resistor described above includes a junction resistance with both electrodes and resistance of the electrodes.

It is possible to express that the quantum cell has a configuration in which a number of such equivalent elements are connected in parallel. Strictly speaking, a resistor causing a leaking current (Rleak) is also connected in parallel, but is omitted here regarding that the resistance value thereof is sufficiently large.

(A-3) Idea of Repair (Electrical Repair) According to this Embodiment

In sheet type (parallel plate structure) devices such as quantum cells, the occurrence of a pin hole may cause defects such as a short circuit between layers and generation of foreign substances and unnecessary voids. Moreover, the coating pyrolysis method is applied for generating a charging layer of the quantum cell, and the charging layer formed by the coating-pyrolysis method and the interface thereof may have molecules in which the connection of atoms and electrons is insufficient.

In this embodiment, in view of the semiconductor characteristics of the quantum cell, two kinds of electrical stimulation of reverse bias and forward bias are applied to repair the above-described defects. Incidentally, in chemical cells such as LIBs, the application with reversed polarity may have a significant influence on safety and reliability. In the reverse bias application on the quantum cell, it is possible to apply electrical stimulation until a semiconductor VBD (breakdown voltage) or until a charging layer VWS (withstand voltage) or VED (electrostatic discharge voltage). Normally, VWS and VED are sufficiently higher than VBD.

(A-4) Configuration of Repair Apparatus According to this Embodiment

Next, a configuration of a repair apparatus according to this embodiment will be described. FIG. 3 is a block diagram showing a configuration of a repair apparatus according to the embodiment.

A repair apparatus 10 according to this embodiment includes an I-mode (current mode) repair unit 20, a V-mode (voltage mode) repair unit 30, mode selection switches 40 and 41, a repair object connection switch 42, a load resistor 43, and a controller 44.

The I-mode repair unit 20 applies (lets flow) a current for repair to the quantum cell 1 to be repaired, under control of the controller 44. In this description, a mode for repair with action of a current is referred to as an I-mode. The I-mode repair unit 20 includes a variable current source 21, a current limit circuit 22, and a voltage meter 23. The variable current source 21 supplies a current to be applied to the quantum cell 1, under control of the controller 44, and can vary not only the supply current but also the direction of the current to be supplied. The current limit circuit 22 limits the upper limit of a current flowing to the quantum cell 1, under control of the controller 44, which can prevent the flow of an excessive overcurrent to the quantum cell 1. The voltage meter 23 detects a both-end voltage of the quantum cell 1 while a current is supplied to the quantum cell 1, and the detected voltage is provided to the controller 44.

The V-mode repair unit 30 applies a voltage for repair to the quantum cell 1 to be repaired, under control of the controller 44. In this description, a mode for repair with action of a voltage is referred to as a V-mode. The V-mode repair unit 30 includes a variable voltage source 31, a voltage limit circuit 32, and an ammeter 33. The variable voltage source 31 generates a voltage to be applied to the quantum cell 1, under control of the controller 44, and can vary not only the applied voltage but also the direction of the voltage to be applied (forward bias, reverse bias). The voltage limit circuit 32 limits the upper limit of a voltage to be applied to the quantum cell 1, under control of the controller 44, which can prevent the application of an excessive overvoltage to the quantum cell 1. The ammeter 33 detects a current flowing to the quantum cell 1 while a voltage is applied to the quantum cell 1, and the detected current is provided to the controller 44.

A pair of mode selection switches 40 and 41 are switched in an interlocking manner under control of the controller 44, and connect either of the I-mode repair unit 20 and the V-mode repair unit 30 to the quantum cell 1.

The repair object connection switch 42 connects the quantum cell 1 to be repaired to the I-mode repair unit 20 or the V-mode repair unit 30 that is selected at that time, or separates the quantum cell 1 to be repaired from the I-mode repair unit 20 or the V-mode repair unit 30, under control of the controller 44.

The load resistor 43 is connected to the quantum cell 1 when the quantum cell 1 to be repaired is separated from the I-mode repair unit 20 or the V-mode repair unit 30, and discharges the quantum cell 1 into the empty state.

The controller 44 controls the entire operation of the electrical repair apparatus 10. The control method of the controller 44 will be clarified below.

Here, for the connection between the quantum cell 1 and the electrical repair apparatus 10, a method of connecting terminals of the electrical repair apparatus 10 to the positive electrode terminal 7 and the negative electrode terminal 6 of the quantum cell 1 can be applied. Instead of terminal connection to the positive electrode terminal 7, a method of bringing ends of a plurality of probes whose base ends are connected in common into contact with the surface of the positive electrode 4 may be used. Instead, one probe may be brought into contact with the surface of the positive electrode 4 and the controller 44 may specify a change of the contact position. In the case of the quantum cell 1 removed from the substrate 5, probe contact to the surface may be used also for the negative electrode 3.

(A-5) Repair with Reverse Bias Application

FIG. 4 schematically shows repair with reverse bias application. Also in the repair with reverse bias application, I-mode repair and V-mode repair can be applied. FIG. 4 shows the case in which I-mode repair is performed before V-mode repair.

In FIG. 4, the element representation parts with a hatch represent defected parts. The defect represented by diode element representation with a hatch represents a defect whose diode characteristics remain slightly, and the defect represented by a rectangle with a hatch represents a defect that does not exhibit diode characteristics.

In the repair by Joule heat, foreign substances causing a short circuit are evaporated and the defected part becomes open, or blackened (oxidized) and insulated, by Joule heat basically generated by letting a current flow into a short circuit section. When the position of a short circuit section is recognized, a current source may be brought into contact with the position. Even when the position is not recognized, a current flows in a concentrated manner into the short circuit section with little decrease of a voltage because resistance values of the negative electrode 3 and the positive electrode 4 are sufficiently low, which makes it possible to generate Joule heat at the section. When there is a short circuit, a voltage between electrodes generated by application of a current is low. However, when the short circuit section is repaired, a voltage value increases. It is to be noted that, depending on the condition of the short circuit section, the defected part may not be open at once, causing a change to a limited resistance value.

Next, it is considered that, when VBG (voltage corresponding to a band gap) is applied with reverse bias on a portion that does not function sufficiently as a semiconductor due to insufficient electronic coupling, insufficiently-coupled electrons are cut off from atoms and the portion almost becomes into an open state. The charging layer 2 of the quantum cell 1 is constituted by a semiconductor of metal oxide, and does not become a semiconductor but an insulator unless electrons are coupled to the metal oxide. When the material of the charging layer 2 includes a plurality of kinds of semiconductors, there exist VBG1, VBG2, . . . (the value is smaller as the number of symbols is smaller) depending on the kinds, and there exist VBD1, VBD2, . . . , as being unique to the respective semiconductors having values sufficiently larger than VBG.

In the case of reverse bias application, repair with Joule heat due to a current from the variable current source 21 (I-mode repair) is intended, as described above. The current application direction is a direction in which a current flows in the order of the negative electrode 3, the charging layer 2, and the positive electrode 4, as shown in FIG. 4(B). In this case, the controller 44 performs control to gradually increase a current value within a range in which the voltage between the electrodes 3 and 4 of the quantum cell 1 does not exceed VBGi (that is currently intended, among VBG1, VBG2, . . . ) while monitoring the voltage using the voltage meter 23. When the voltage exceeds VBGi, the controller 44 performs control to immediately return the current value to zero. The controller 44 controls such that, every time a current is increased, the current is kept during a certain period of time so that Joule heat is sufficiently transmitted to the short circuit section, and returns, even in such a period of time, the current value to zero once the measured voltage value varies and exceeds VBGi. If the controller 44 controls such that the voltage between the electrodes 3 and 4 becomes zero when the current is returned to zero (reset through a resistor, or connection of a zero voltage source, for example; FIG. 3 shows the configuration in the former case), it is possible to make residual electric charge of the quantum cell 1 generated by reverse bias application zero or make unnecessary charging empty, which prevents unexpected damages to the device (quantum cell) when the next step is performed. When a short circuit section is considerably firm and is not repaired by Joule heat, it is possible that a current continues flowing without increase of a voltage value and burns the quantum cell 1 to be broken. Thus, when the upper limit of time in which a current is made flow continuously is set preliminarily and the controller 44 returns the current to zero once time measured by an inner timer reaches the upper limit of time, it is possible to prevent the burnout.

Figure 5:
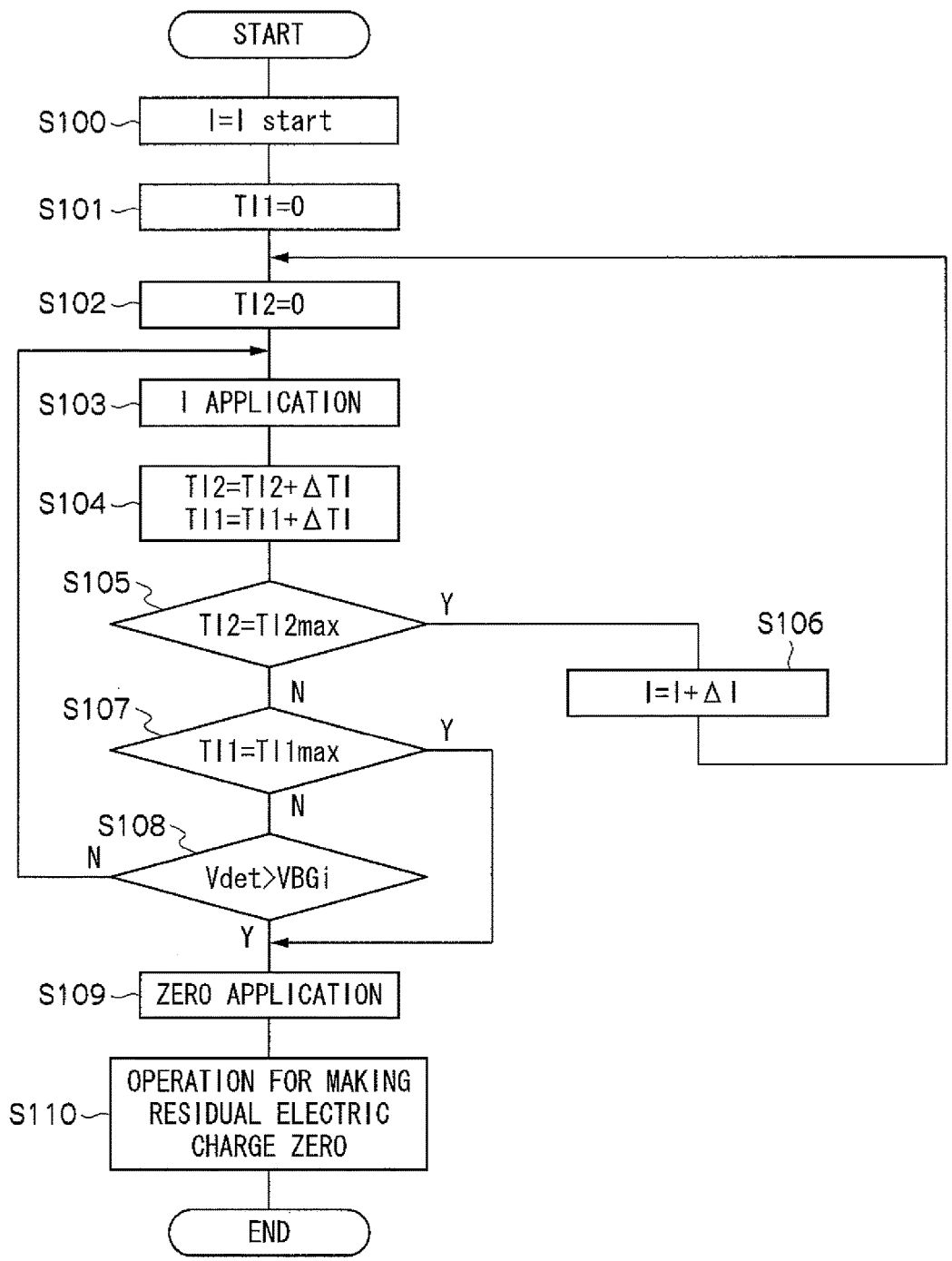
FIG. 5 is a flowchart showing a reverse bias I-mode repair operation in the repair apparatus according to the embodiment.

FIG. 5 is a flowchart showing the processing of the controller 44 that executes the operation of reverse bias I-mode repair described above. The operation contents have been already explained, and thus the detailed explanation thereof with the use of FIG. 5 is omitted. The parameter notation in FIG. 5 is explained as follows. I represents an applied current, Istart represents an initial applied current, and ΔI represents an increase amount of an applied current. TI1 represents a timer value for measuring the upper limit TI1max of time during which an applied current is made flow regardless of a value of the applied current I, and is updated in every unit time ΔTI. TI2 represents a timer value for measuring the upper limit TI2max of time during which an applied current of a currently-applied current value is made flow, and is updated in every unit time ΔTI. Vdet represents voltage detected by the voltage meter 23.

Figure 4A:
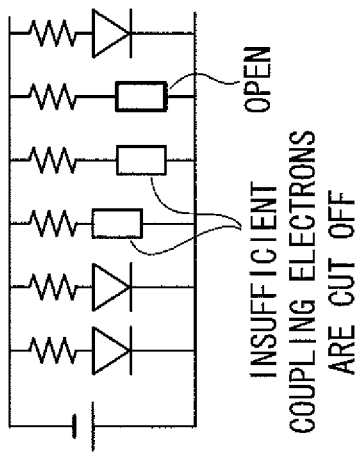
FIG. 4 is an explanatory view showing situations of repair with reverse bias application according to the embodiment.
Figure 4B:
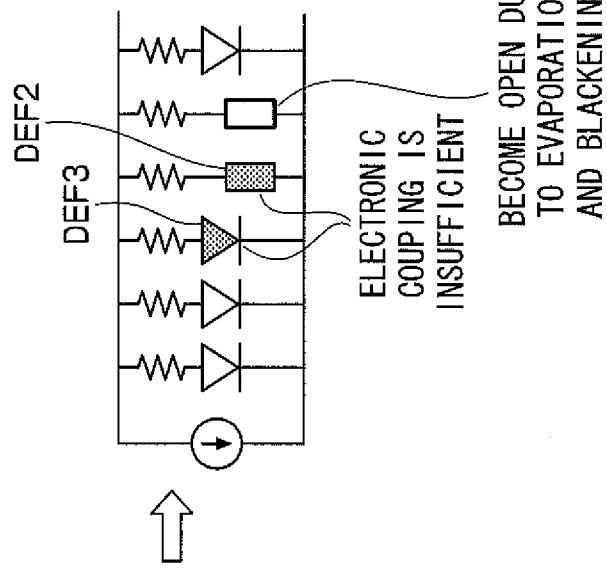

For example, even when the quantum cell 1 includes a short circuit section DEF1 as shown in FIG. 4(A), the short circuit section DEF1 is detoxified by I-mode repair with reverse bias application, as shown in FIG. 4(B).

The reverse bias V-mode repair is performed after the reverse bias I-mode repair. The controller 44 applies a voltage due to the variable voltage source 31 on a portion between the electrodes 4 and 3 of the quantum cell 1 in the reverse bias direction (see FIG. 4(C)), and gradually increases the value of an applied voltage while monitoring the current flowing at that time using the ammeter 33. A current flows unless a semiconductor sufficiently develops the characteristics. However, when insufficient coupling of electrons is cut off into nearly the state of an insulator, a current flows hardly. The controller 44 increases the value of an applied voltage until reaching VBGi, and returns, the applied voltage value to zero once when a current flows hardly. In this case, once the applied voltage value is returned to zero, no residual electric charge or unnecessary charging exists. Also in V-mode repair, the upper limit of operation time is set so that the operation time is not prolonged uselessly.

Figure 6:
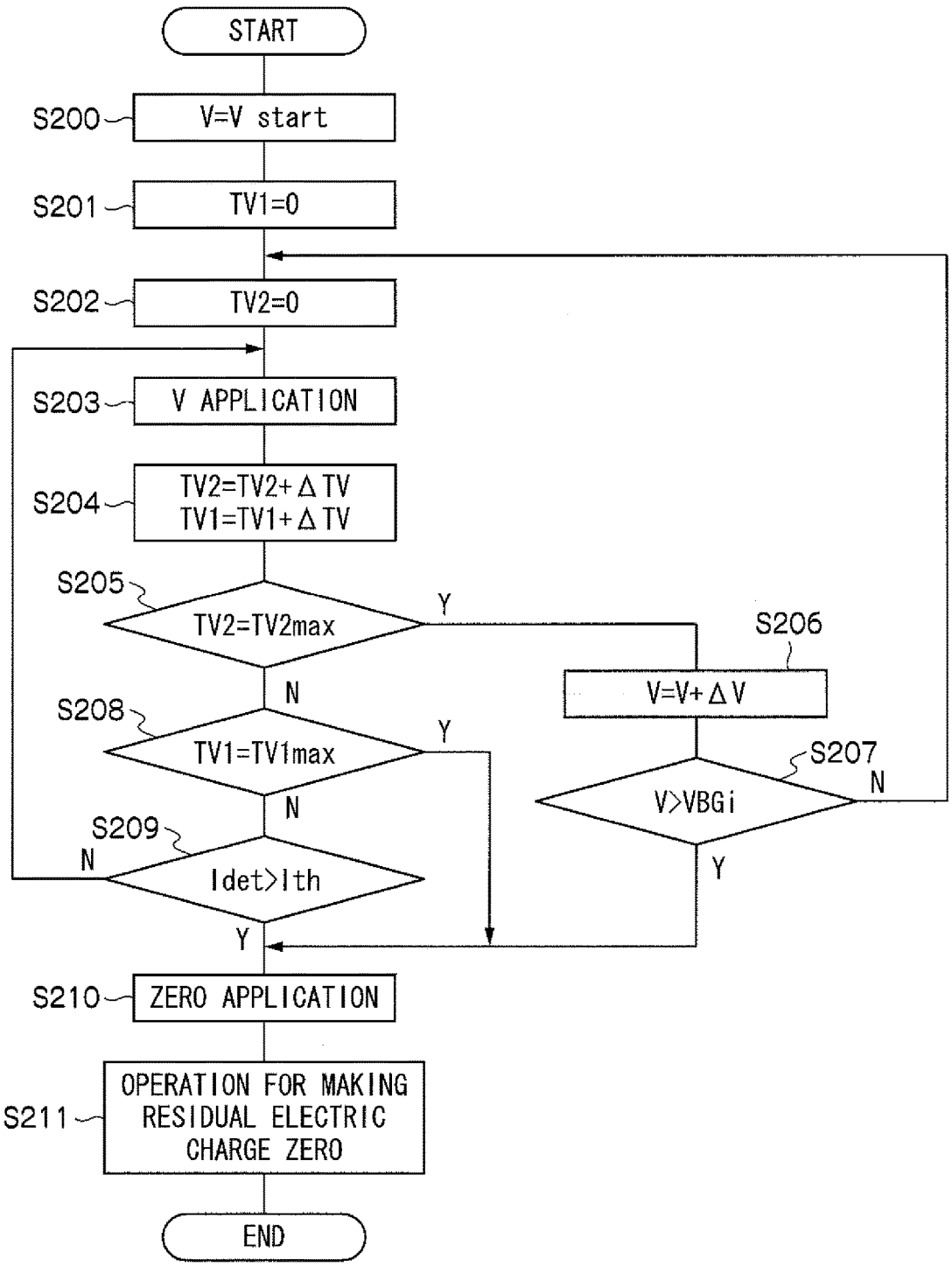
FIG. 6 is a flowchart showing a reverse bias V-mode repair operation in the repair apparatus according to the embodiment.

FIG. 6 is a flowchart showing the processing of the controller 44 that executes the operation of reverse bias V-mode repair described above. The operation contents have been already explained, and thus the detailed explanation thereof with the use of FIG. 6 is omitted. The parameter notation in FIG. 6 is explained as follows. V represents an applied voltage, Vstart represents an initial applied voltage, and ΔV represents an increase amount of an applied voltage. TV1 represents a timer value for measuring the upper limit TV1max of time during which an applied voltage is applied regardless of a value of the applied voltage V, and is updated in every unit time ΔTV. TV2 represents a timer value for measuring the upper limit TV2max of time during which a current voltage value is applied, and is updated in every unit time ΔTV. Idet represents a current detected by the ammeter 33.

Figure 4C:
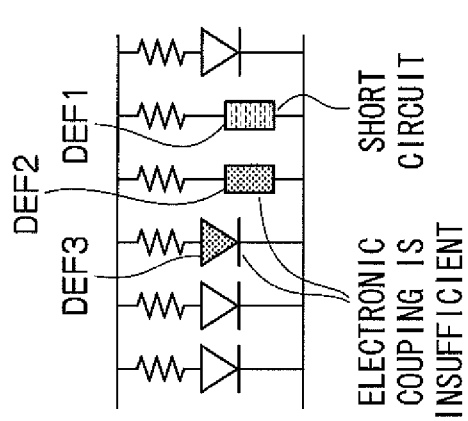

For example, even when the quantum cell 1 includes defects DEF2 and DEF3 where electronic coupling is insufficient as shown in FIG. 4(A), the defects DEF2 and DEF3 with insufficient electronic coupling are detoxified by V-mode repair with reverse bias application in a way where the insufficiently-coupled electrons are cut off from atoms and the defected part almost becomes into an open state, as shown in FIG. 4(C).

The operations with reverse bias of current-application/voltage-monitoring (I-mode repair) and voltage-application/current-monitoring (V-mode repair) are performed alternately with VBG1, VBG2, . . . as breakpoints, that is, such operations are performed alternately for each of intervals of 0 to VBG1, VBG1 to VBG2, VBG2 to VBG 3, . . . , whereby it is possible to perform repair while suppressing damages caused to the device (quantum cell 1) to minimum. Here, it is required, in any cases, that the voltage value between the electrodes 3 and 4 of the quantum cell 1 does not exceed VBDmin (smallest value among VBD1, VBD2, . . . ).

(A-6) Repair with Forward Bias Application

Figure 7:
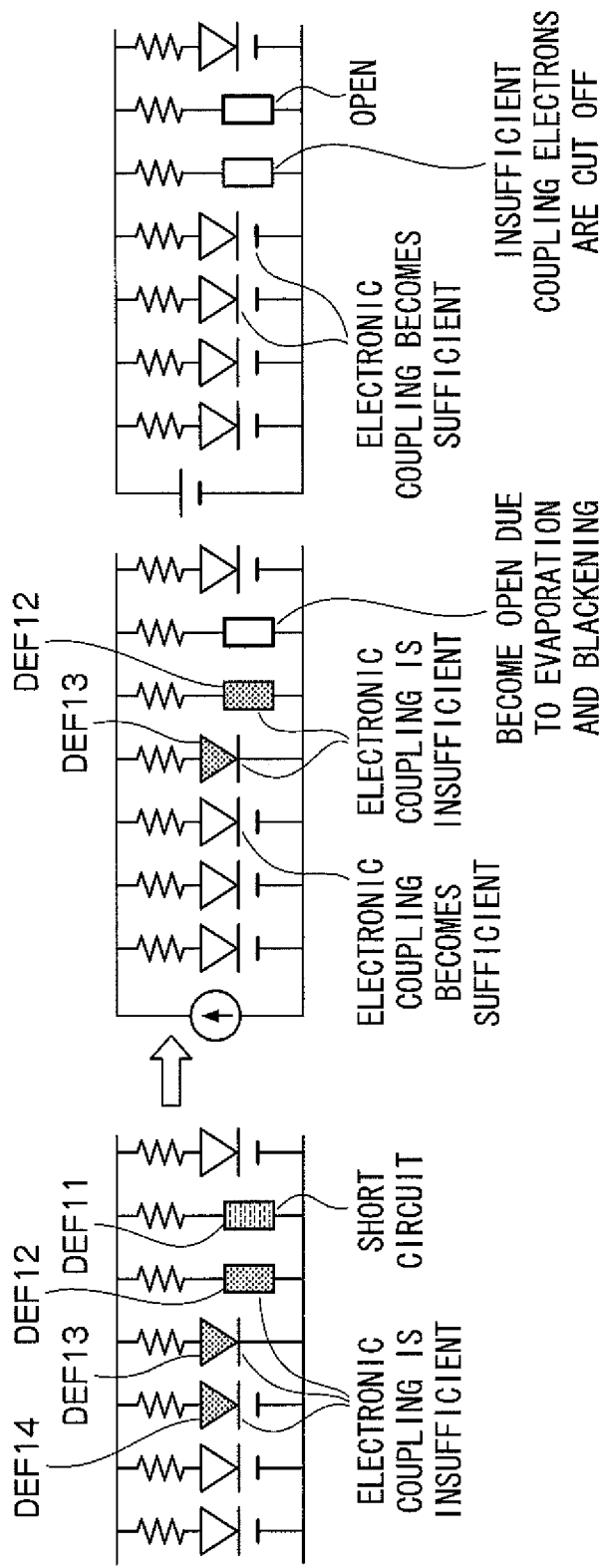
FIG. 7 is an explanatory view showing situations of repair with forward bias application according to the embodiment.

FIG. 7 schematically shows repair with forward bias application. Also in the repair with forward bias application, I-mode repair and V-mode repair can be applied. FIG. 7 shows the case in which I-mode repair is performed before V-mode rep air.

In FIG. 7, the element representation parts with a hatch represent defected parts. The defect represented by quantum cell element representation with a hatch represents a defect whose quantum cell characteristics remain slightly, and the defect represented by diode element representation with a hatch represents a defect whose diode characteristics remain slightly. The defect represented by a rectangle with a hatch represents a defect that does not exhibit diode characteristics.

The difference from reverse bias application lies in that the quantum cell 1 performs an charging operation (and also performs a discharging operation depending on a case) by forward bias application (of any of a current and a voltage) as long as the quantum cell 1 is not in the complete short circuit state.

As described above, the short circuit section is repaired by reverse bias current application. However, if the short circuit section has pure resistance, it can be repaired by the same principle (by Joule heat) even when a forward bias current is made flow.

Also in this case, the controller 44 gradually increases the value of an applied current of the variable current source 21 in a range of being equal to or less than a maximum allowable voltage for charging of the quantum cell 1, while monitoring the voltage between the electrodes 4 and 3 by output of the voltage meter 23. The application direction in this case is a forward bias direction as shown in FIG. 7(B). When the short circuit section remains, a major part of a current is concentrated in the short circuit section, and a voltage is generated in accordance with the resistance value. However, when the short circuit section is repaired, the voltage increases, and thus the controller 44 returns the applied current value of the variable current source 21 to zero once at that time.

Next, when the controller 44 gradually increases the value of an applied current of the variable current source 21 while monitoring the voltage between the electrodes 4 and 3, the current may flow in the section where electronic coupling is insufficient, which recovers coupling. Also in this case, the applied current value and the detection voltage value are controlled not to exceed the maximum allowable value for charging. The controller 44 lets a constant applied current flow from the variable current source 21 for a predetermined period of time, and returns, when the variation of a voltage value is within a set range, the applied current from the variable current source 21 to zero. At that time, the controller 44 controls such that the voltage between the electrodes 4 and 3 becomes zero (reset through a resistor or connection of a zero voltage source, for example; FIG. 3 shows the configuration in the former case), and then finishes the repair operation with a forward bias current. When the applied voltage between the electrodes 4 and 3 is controlled to become zero, the residual electric charge of the quantum cell 1 is emitted by a discharging operation, and the quantum cell 1 is discharged into the empty state. This can prevent unexpected damages to the device (quantum cell 1) when the next step is performed.

Figure 8:
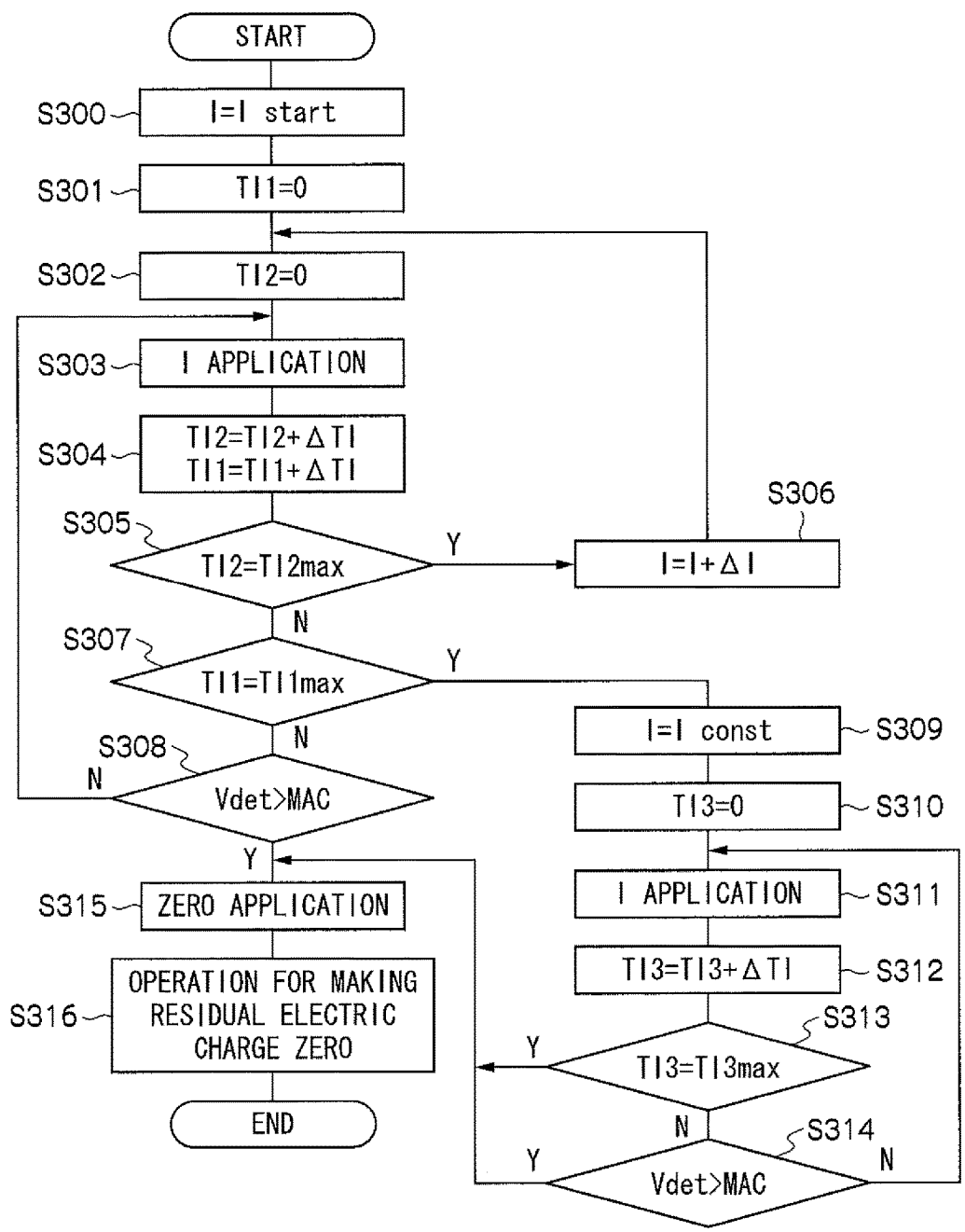
FIG. 8 is a flowchart showing a forward bias I-mode repair operation in the repair apparatus according to the embodiment.

FIG. 8 is a flowchart showing the processing of the controller 44 that executes the operation of forward bias I-mode repair described above. The operation contents have been already explained, and thus the detailed explanation thereof with the use of FIG. 8 is omitted. The parameter notation in FIG. 8 is explained as follows. I represents an applied current, Istart represents an initial applied current for detoxifying the short circuit section, and ΔI represents an increase amount of an applied current. Icost represents a constant applied current for recovering the coupling of a portion where electric coupling is insufficient. TI1 represents a timer value for measuring the upper limit TI1max of time during which an applied current is made flow for detoxifying the short circuit section regardless of a value of the applied current I, and is updated in every unit time ΔTI. TI2 represents a timer value for measuring the upper limit TI2max of time during which an applied current of a currently-applied current value is made flow for detoxifying the short circuit section, and is updated in every unit time ΔTI. TI3 represents a timer value for measuring a period of time during which a constant current value is made flow for recovering the coupling of a portion where electronic coupling is insufficient, and is updated in every unit time ΔTI. MAV represents a maximum allowable voltage for charging of the quantum cell 1. Vdet represents a voltage detected by the voltage meter 23.

For example, even when the quantum cell 1 includes a short circuit section DEF 11 as shown in FIG. 7(A), the short circuit section DEF11 is detoxified by I-mode repair with forward bias application, as shown in FIG. 7(B). Also for example, even when the quantum cell 1 includes defects DEF12 to DEF14 where electronic coupling is insufficient as shown in FIG. 7(A), some of such defects may be recovered by I-mode repair with forward bias application in a way where electronic coupling becomes sufficient. As shown in FIG. 7(B), the defect DEF14 is a defect in which electronic coupling is recovered by I-mode repair with forward bias application.

The forward bias V-mode repair is performed after the forward bias I-mode repair. The controller 44 applies a voltage due to the variable voltage source 31 on a portion between the electrodes 4 and 3 of the quantum cell 1 in the forward bias direction (see FIG. 7(C)), and gradually increases the value of an applied voltage while monitoring the current flowing at that time using the ammeter 33. The application of a voltage causes an electric field on the portion where electronic coupling is insufficient, which may recover the coupling. On the other hand, when the portion hardly functions as a semiconductor, the insufficiently-coupled electrons may be cut off for detoxification. Also in this operation, the applied voltage value and the detection current value are controlled not to exceed the maximum allowable value for charging. When the successive application of a plurality of constant voltages that requires predetermined total necessary time is finished without exceeding the setting range of the detection current value, the controller 44 returns the applied voltage value to zero. Also in this case, the controller 44 subsequently performs an operation to make the quantum cell 1 in the state with no residual electric charge and the state with empty charging by discharging through a resistor, etc. and then finishes the repair operation with forward bias voltage.

Figure 9:
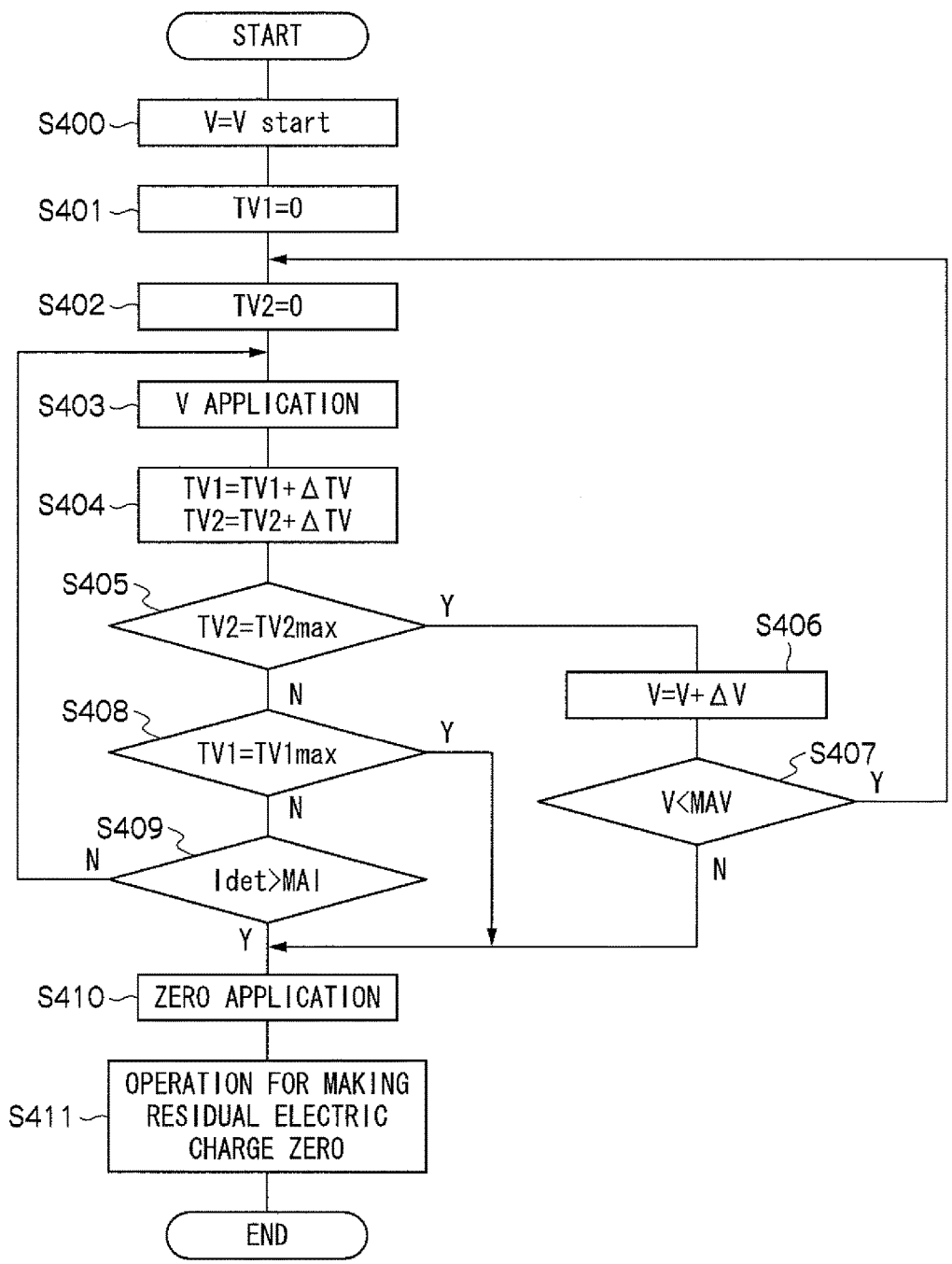
FIG. 9 is a flowchart showing a forward bias V-mode repair operation in the repair apparatus according to the embodiment.

FIG. 9 is a flowchart showing the processing of the controller 44 that executes the operation of forward bias V-mode repair described above. The operation contents have been already explained, and thus the detailed explanation thereof with the use of FIG. 9 is omitted. The parameter notation in FIG. 9 is explained as follows. V represents an applied voltage, Vstart represents an initial applied voltage, and ΔV represents an increase amount of an applied voltage. TV1 represents a timer value for measuring the upper limit TV1max of time during which an applied voltage is applied regardless of a value of the applied voltage V, and is updated in every unit time ΔTV. TV2 represents a timer value for measuring the upper limit TV2max of time during which a current voltage value is applied, and is updated in every unit time ΔTV. Idet represents a current detected by the ammeter 33. MAV represents a maximum allowable voltage for charging of the quantum cell 1. MAI represents a maximum allowable current for charging of the quantum cell 1.

For example, even when the quantum cell 1 includes the defects DEF12 to DEF14 where electronic coupling is insufficient as shown in FIG. 7(A), some of such defects are recovered in a way where electronic coupling becomes sufficient, while some of them are detoxified in a way where insufficiently-coupled electrons are cut off, by V-mode repair with forward bias application. As shown in FIG. 7(C), the defect DEF13 represents a defect in which electronic coupling is recovered by V-mode repair with forward bias application. The defect DEF12 represents a defect detoxified in a way that insufficiently-coupled electrons are cut off by V-mode repair with forward bias application.

(A-7) Effect of Embodiment

According to the above-described embodiment, the defects of the sheet type cell having semiconductor characteristics can be appropriately recovered and detoxified.

Here, in order to physically remove foreign substances and short circuit sections by a laser, etc., or fill pinholes causing short circuit defects with a resist, etc., a position needs to be specified first. However, the electrical repair applied in the above-described embodiment does not need such specification. The repair is performed by evaluating electrical characteristics after applying electrical stimulation that is preliminarily regarded as effective. Thus, it is not necessary to specify a position of the defect and physically repair the defect from the outside.

According to the above-described embodiment, the method of generating Joule heat in the short circuit section by reverse bias and evaporating or blackening (oxidizing) foreign substances to make the short circuit section open is applied, and in addition, the operation for cutting off insufficient electronic coupling or making coupling sufficient is performed. Therefore, it is possible to not only merely detoxify the defect but also improve the efficiency of the sheet type cell.

According to the sequence of the above-described embodiment (reverse bias I-mode repair and V-mode repair=>forward bias I-mode repair and V-mode repair), it is possible to prevent unexpected damages to the device in an electrical repair operation, and discharge the sheet type cell to return the state to the empty state after a repair operation or between different repair operations.

From another point of view, the controller controls such that, when the kinds of electrical stimulation are switched, new kind of electrical stimulation is applied between the positive electrode and the negative electrode after the empty state is realized or residual electric charge is released (see S110 in FIG. 5, S211 in FIG. 6, and S316 in FIG. 8). Here, it is to be noted that the operation by the empty state realization means in claims includes at least one of realization of empty electric charge and release of residual electric charge. Therefore, it is possible to prevent unexpected damages to the device even when the electrical stimulation is switched to a new kind.

According to the above-described embodiment, the controller controls such that all kinds of electrical stimulation to which the electrical stimulation source of the repair apparatus is adaptive are sequentially applied between the positive electrode and the negative electrode of the quantum cell (reverse bias I-mode repair, reverse bias V-mode repair, forward bias I-mode repair, and forward bias V-mode repair). Thus, repair can be performed to the maximum.

(B) Other Embodiments

The present invention is not limited to the above-described embodiment. Hereinafter, some variant embodiments will be exemplified.

(B-1) According to the above-described embodiment, the explanation is given to the case where I-mode (current mode) repair and V-mode (voltage mode) repair can be performed. In addition to these, or instead of all of these or a part of these, P-mode (power mode) repair may be performed. For example, it is possible to consider that the blackening of the short circuit section due to Joule heat is caused by supply power, more specifically, rather than by a supply current. That is, the P-mode repair can be also applied.

Figure 10:
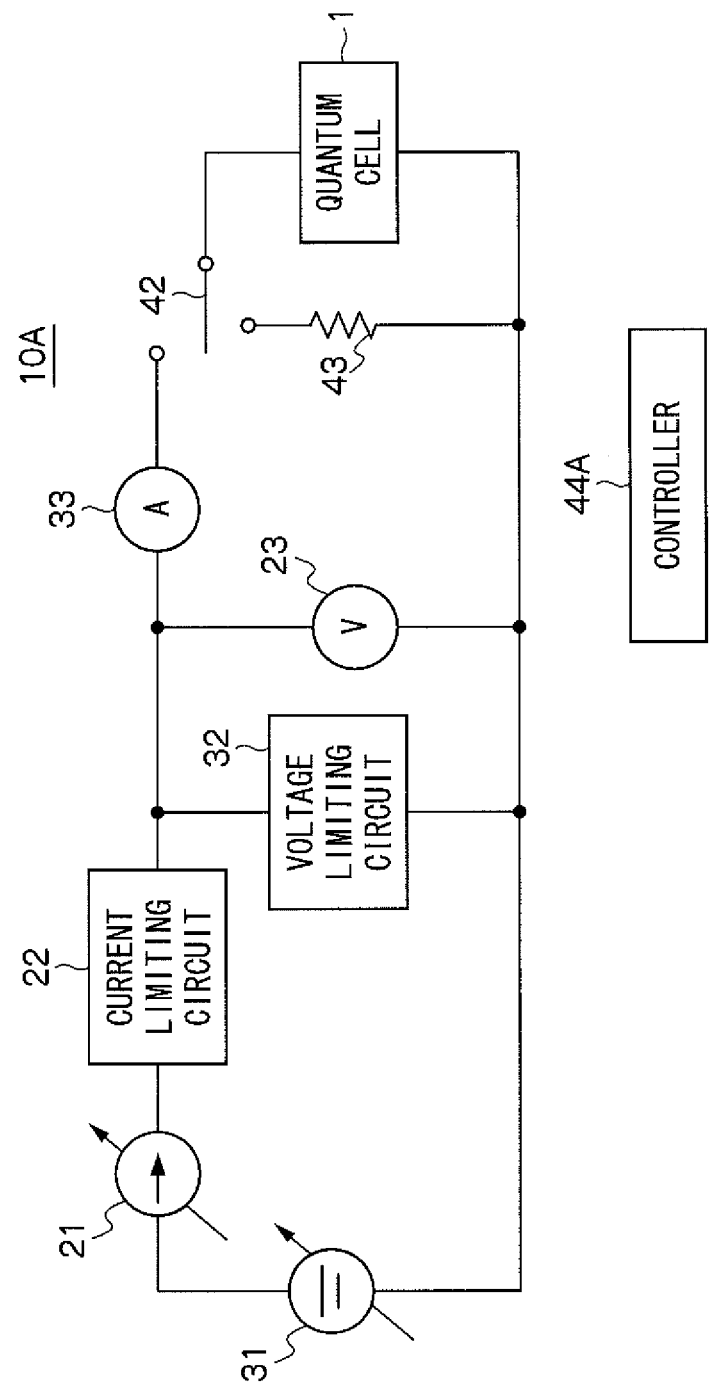
FIG. 10 is a block diagram showing a configuration of a repair apparatus of a sheet type cell according to a variant embodiment.

FIG. 10 is a block diagram showing a repair apparatus 10A of a variant example that is adaptive to P-mode repair, in which the same numerals and symbols will be used to designate the same or corresponding components as those in FIG. 3 showing the repair apparatus 10 of the above-described embodiment.

In FIG. 10, a controller 44A controls such that a constant current value is made flow by the variable current source 21 (direction is also defined) and a constant voltage value is applied by the variable voltage source 31 (direction is also defined), whereby constant power can be applied (made flow) to the quantum cell 1 to be repaired. That is, P-mode repair can be performed.

Moreover, the controller 44A controls such that the variable voltage source 31 does not apply a constant voltage and the variable current source 21 supplies a constant value of current, whereby I-mode repair can be performed.

Furthermore, the controller 44A controls such that the variable current source 21 does not supply a constant current and the variable voltage source 31 applies a constant value of voltage, whereby V-mode repair can be performed.

(B-2) According to the above-described embodiment, the explanation is given to the case in which one electrical repair apparatus can perform reverse bias I-mode repair and V-mode repair, and forward bias I-mode repair and V-mode repair. It is natural that the electrical repair apparatus may be configured to perform only a part of these four kinds of repair. In such a case, it is required that a plurality of electrical repair apparatuses sequentially perform repair so as to perform four kinds of repair, for example.

(B-3) According to the above-described embodiment, the explanation is given to the case in which four kinds of repair are performed in the order of reverse bias I-mode repair and V-mode repair, and forward bias I-mode repair and V-mode repair. The order of repair is not limited to the order in the above-described embodiment as long as damages to the device can be prevented by improving a current monitoring function and a voltage monitoring function.

(B-4) According to the above-described embodiment, the explanation is given to the case in which the variable current source or the variable voltage source, which is an electrical stimulation source, outputs a DC current or DC voltage specified at that time. Instead of the variable current source or the variable voltage source, an arbitrary waveform generator (AWG) may be applied as an electrical stimulation source so that AC stimulation is applied as well as DC stimulation. Examples thereof include sine waves, square waves, sawtooth waves, and pulse waves. It is considered that energy due to frequency components is added to a DC current and a DC voltage, which makes it possible to efficiently perform the repair operation.

Here, when a frequency with an arbitrary waveform is selected as a unique frequency of the material of the charging layer, etc., it is possible to add energy efficiently.

(B-5) According to the above-described embodiment, the explanation is given to the case in which realization of empty charging or discharging of residual electric charge is performed when the kinds of repair are switched. Depending on the selection of a current value and a voltage value at the start of new repair, realization of empty charging or discharging of residual electric charge when the kinds of repair are switched may be omitted.

(B-6) According to the above-described embodiment, the explanation is given to the case in which any objects to be repaired are repaired in the same sequence. The information in the past repair may be reflected in the subsequent repair of an object to be repaired. For example, electrical repair is applied to a number of quantum cells manufactured with the same materials and in the same process, and variation points of voltage values and current values detected during repair operations are collected. Then, the electrical stimulation amount corresponding to the variation points is processed statistically, whereby conditions for the occurrence of repair are predicted. Thus, instead of varying electrical stimulation gradually, electrical stimulation is set immediately for a target condition for repair. Alternatively, electrical stimulation is controlled to vary for a target condition from a value slightly deviated from the target condition. In this manner, it is possible to improve throughput.

The invention claimed is:

1. A repair apparatus for repairing a sheet type secondary cell in which a storage layer is sandwiched by layers of a positive electrode and a negative electrode and at least the storage layer has semiconductor characteristics, the repair apparatus comprising:
    an electrical stimulation source that applies electrical stimulation in a reverse bias direction between the positive electrode and the negative electrode;

an electrical characteristic measurement means that measures electrical characteristics of the sheet type secondary cell when the electrical stimulation is applied; and
a control means that controls a value of the electrical stimulation for the electrical stimulation source based on measured electrical characteristics,
wherein the control means first instructs the electrical stimulation source to apply current or power stimulation by a current whose value is controlled by the control means and which is applied in the reverse bias direction to achieve repair of a short circuit between the positive electrode and the negative electrode, as indicated by an increase in a voltage value between the negative and positive electrodes, and
wherein the control means then instructs the electrical stimulation source to apply voltage or power stimulation by a voltage whose value is controlled by the control means and which is applied in the reverse bias direction to achieve repair of electronic coupling defects in the secondary cell, as indicated by an increase in a current between the negative and positive electrodes.

2. The repair apparatus of the sheet type secondary cell according to claim 1, further comprising
a limit means in which the electrical stimulation source limits an upper limit of the electrical stimulation to be applied between the positive electrode and the negative electrode.

3. The repair apparatus of the sheet type secondary cell according to claim 1, further comprising an empty state realization means that discharges the sheet type secondary cell into an empty state.

4. A repair apparatus for repairing a sheet type secondary cell in which a storage layer is sandwiched by layers of a positive electrode and a negative electrode and at least the storage layer has semiconductor characteristics, the repair apparatus comprising:
an electrical stimulation source that applies electrical stimulation in a reverse bias direction between the positive electrode and the negative electrode;
an electrical characteristic measurement means that measures electrical characteristics of the sheet type secondary cell when the electrical stimulation is applied; and
a control means that controls a value of the electrical stimulation for the electrical stimulation source based on measured electrical characteristics,
wherein the electrical stimulation source is adaptive to two kinds or more among current stimulation in the reverse bias direction to achieve repair of a short circuit between the positive electrode and the negative electrode, as indicated by an increase in a voltage value between the negative and positive electrodes, voltage stimulation in the reverse bias direction to achieve repair of electronic coupling defects in the secondary cell, as indicated by an increase in a current between the negative and positive electrodes, current stimulation in a forward bias direction to achieve said repair of a short circuit between the positive electrode and the negative electrode, and voltage stimulation in the forward bias direction to achieve said repair of electronic coupling defects in the secondary cell, and
the control means controls the electrical stimulation source such that all kinds of electrical stimulation to which the electrical stimulation source is adaptive are sequentially applied between the positive electrode and the negative electrode.

5. The repair apparatus of the sheet type secondary cell according to claim 4, further comprising
an empty state realization means that discharges the sheet type cell into an empty state,
wherein the control means controls the electrical stimulation source, when switching the kinds of electrical stimulation, such that a new kind of electrical stimulation is applied between the positive electrode and the negative electrode after an operation of the empty state realization means is performed.

6. A repair apparatus for repairing a sheet type secondary cell in which a storage layer is sandwiched by layers of a positive electrode and a negative electrode and at least the storage layer has semiconductor characteristics, the repair apparatus comprising:
an electrical stimulation source that applies electrical stimulation in a forward bias direction between the positive electrode and the negative electrode;
an electrical characteristic measurement means that measures electrical characteristics of the sheet type secondary cell when the electrical stimulation is applied; and
a control means that controls a value of the electrical stimulation for the electrical stimulation source based on measured electrical characteristics,
wherein the control means first instructs the electrical stimulation source to apply current or power stimulation by a current whose value is controlled by the control means and which is applied in the forward bias direction to achieve repair of a short circuit between the positive electrode and the negative electrode, as indicated by an increase in a voltage value between the negative and positive electrodes, and
wherein the control means also instructs the electrical stimulation source to apply the current or power stimulation in the forward bias direction to achieve repair of electronic coupling defects.

7. The repair apparatus of the sheet type secondary cell according to claim 6, further comprising
a limit means that in which the electrical stimulation source limits an upper limit of the electrical stimulation to be applied between the positive electrode and the negative electrode.

8. The repair apparatus of the sheet type secondary cell according to claim 6, further comprising an empty state realization means that discharges the sheet type secondary cell into an empty state.

9. A repair apparatus for repairing a sheet type secondary cell in which a storage layer is sandwiched by layers of a positive electrode and a negative electrode and at least the storage layer has semiconductor characteristics, the repair apparatus comprising:
an electrical stimulation source that applies electrical stimulation in a forward bias direction between the positive electrode and the negative electrode;
an electrical characteristic measurement means that measures electrical characteristics of the sheet type secondary cell when the electrical stimulation is applied; and
a control means that controls a value of the electrical stimulation for the electrical stimulation source based on measured electrical characteristics,
wherein the control means first instructs the electrical stimulation source to apply current or power stimulation by a current whose value is controlled by the control means and which is applied in the forward bias direction to achieve repair of a short circuit between the positive electrode and the negative electrode, as indicated by an increase in a voltage value between the negative and positive electrodes, and wherein the control means then instructs the electrical stimulation source to apply voltage or power stimulation by a voltage whose value is controlled by the control means and which is in the forward bias direction to achieve repair of electronic coupling defects in the secondary cell, as indicated by an increase in current between the negative and positive electrodes.

10. The repair apparatus of the sheet type secondary cell according to claim 9, further comprising a limit means that in which the electrical stimulation source limits an upper limit of the electrical stimulation to be applied between the positive electrode and the negative electrode.

11. The repair apparatus of the sheet type secondary cell according to claim 9, further comprising an empty state realization means that discharges the sheet type secondary cell into an empty state.

\* \* \* \* \*